United States Patent [19]

Cosentino et al.

[11] 4,109,299

[45] Aug. 22, 1978

[54] ELECTRICAL CONNECTION BETWEEN CONDUCTORS ON SPACED PLATES

[75] Inventors: Louis Salvatore Cosentino, Belle Mead; John Guiry Endriz, Plainsboro; George Fairbank Stockdale, Princeton, all of N.J.

[73] Assignee: RCA Corporation, New York, N.Y.

[21] Appl. No.: 718,803

[22] Filed: Aug. 30, 1976

[51] Int. Cl.² .............................................. H05K 1/04
[52] U.S. Cl. ..................................................... 361/412
[58] Field of Search ............... 361/412, 395, 397, 398, 361/393, 407, 408; 339/17 C, 17 LM, 17 M, 17 LC, 222, 19, 275 R, 275 P, 176 MC; 315/169 TV; 174/117 M; 179/94 R

[56] References Cited

U.S. PATENT DOCUMENTS

| | | | |
|---|---|---|---|
| 2,831,071 | 4/1958 | Taylor | 339/222 |
| 2,972,657 | 2/1961 | Stemke | 174/94 R |
| 3,134,049 | 5/1964 | Kilby | 315/393 |
| 3,553,532 | 1/1971 | Cheshire | 361/415 |
| 3,684,014 | 3/1972 | Bennett | 174/94 R |
| 3,904,923 | 9/1975 | Schwartz | 315/169 TV |

FOREIGN PATENT DOCUMENTS 1,284,551  1/1962  France ..................................... 361/412

Primary Examiner—David Smith, Jr.
Attorney, Agent, or Firm—Eugene M. Whitacre; Donald S. Cohen; Dennis H. Irlbeck

[57] ABSTRACT

A substantially flat, flexible, perforated interconnector of an electrically conductive material and such as a metal strip with holes or a metal mesh, is used to electrically connect conductors on a plurality of spaced substantially parallel insulating plates. The strip is placed across the edge of each of the plates adjacent to the conductors. An electrically conductive bonding material is placed on the strip at each plate with the bonding material extending through the openings in the strip and contacting the plates and the conductors. The bonding material adheres to the plates to mechanically secure the strip to the plates and contacts the conductors to provide an electrical connection between the strip and the conductors.

4 Claims, 8 Drawing Figures

ELECTRICAL CONNECTION BETWEEN CONDUCTORS ON SPACED PLATES

BACKGROUND OF THE INVENTION

The present invention relates to an electrical interconnection structure and particularly to an electrical connection between conductors on spaced parallel plates.

Various electrical apparatus include spaced parallel plates having electrical conductors thereon which must be electrically interconnected. For example, a flat display device has been developed which includes an evacuated envelope having spaced, parallel flat front and back panels and a plurality of vanes or plates of an electrical insulating material extending between the front and back panels in spaced, parallel relation. Each of the vanes has a plurality of metal film conductors on its surfaces with corresponding conductors on the vanes being electrically connected together.

One technique proposed is to make the electrical connections by extending the conductors to the edge of the vanes which contact the back panel, and providing metal conductors on the back panel which are contacted by the conductors on the vanes when the vanes are mounted on the back panel. However, this technique has several disadvantages. It requires very acurate positioning of both the conductors on the vanes and the conductors on the back panel to insure proper alignment therebetween when the vanes are mounted on the back panel. Also, to make good electrical connection between the conductors on the vanes and the conductors on the back panel by merely placing the edge of one conductor against the other conductors is difficult, and the difficulty is magnified when a large number of such connections are being made simultaneously. In addition, the connections between the two conductors are not readily accessible so that poor connections cannot be easily repaired.

SUMMARY OF THE INVENTION

An apparatus includes a plurality of spaced plates, each having a conductive surface portion which extend to an edge of the plate. A substantially flat, perforated interconnector of an electrically conductive material extends across each of the edges of said plates adjacent the conductive surface portion. Means is provided to electrically connect the interconnector to the conductive surface portions of the plates. The plates may be of conductive material in their entirety or may be of insulating material with conductive coatings on portions thereof.

DETAILED DESCRIPTION

The electrical connector of the present invention will be described with regard to a flat image display device. However, this electrical connection can be used in any apparatus which requires electrically connecting a plurality of conductors on spaced, parallel plates.

Figure 1:
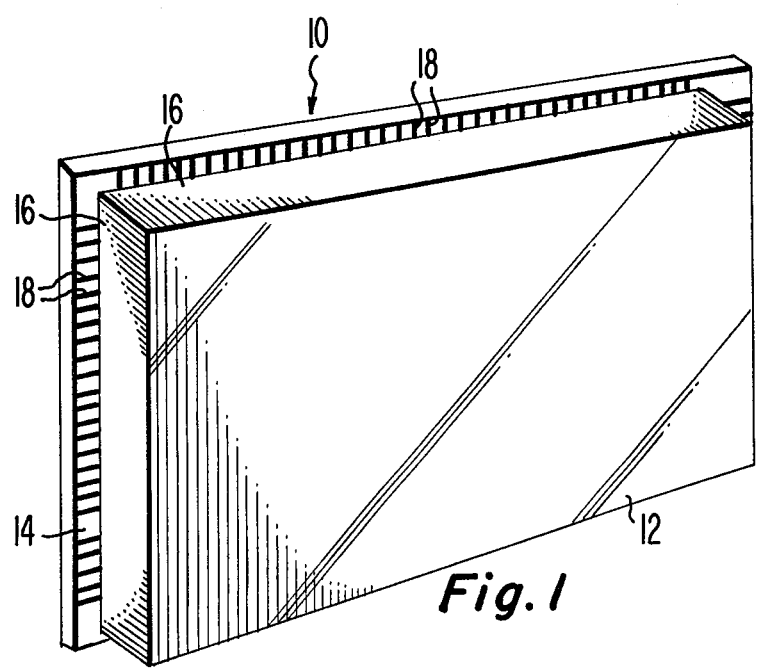
FIG. 1, is a perspective view of a flat panel display device in which the electrical connection of the present invention may be used.

Referring to FIG. 1, a flat image display device which can utilize the electrical connection of the present invention is generally designated at 10. The display device 10 is of the construction shown and described in the application for U.S. Letters Patent of John G. Endriz et al. Ser. No. 672,122, filed Mar. 31, 1976, entitled "Parallel Vane Structure for a Flat Display Device." The display device 10 includes an evacuated glass envelope having a flat transparent viewing front panel 12 and a flat back panel 14. The front and back panels 12 and 14 are parallel and sealed together by peripheral side walls 16. The back panel 14 extends beyond the side wall 16 to form terminal areas on which are leads 18 which interconnect to internal components for activating and controlling the display device 10.

Figure 2:
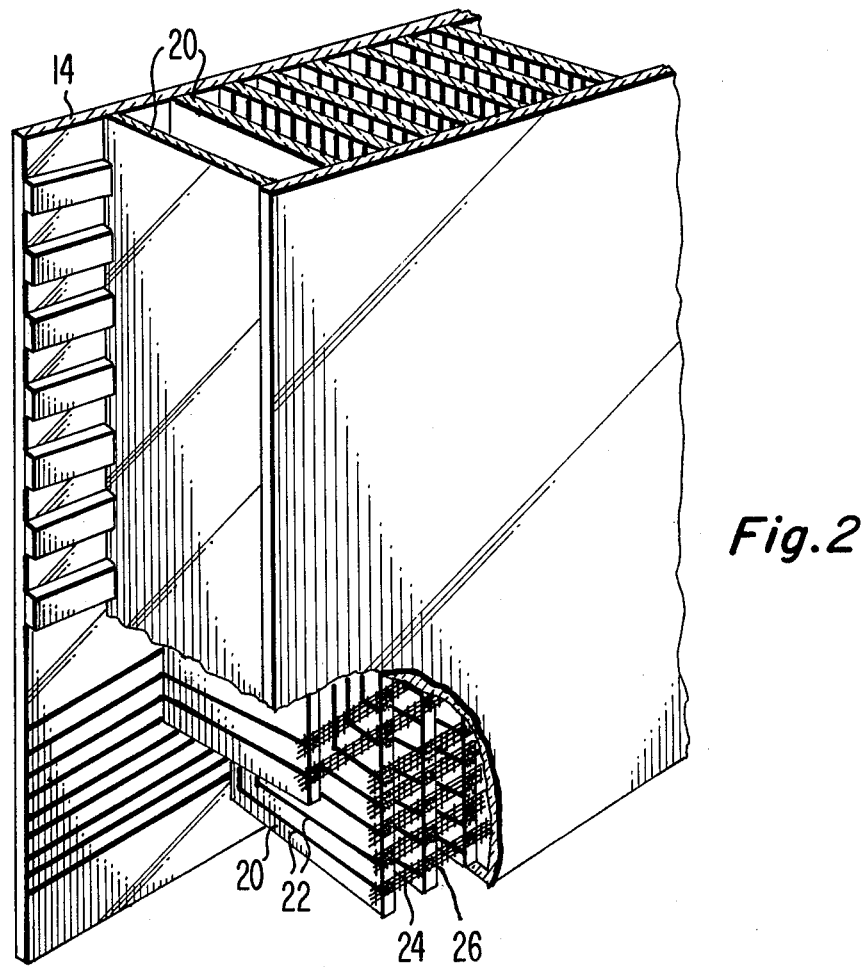
FIG. 2, is an enlargement, partially broken away, of a portion of the display device shown in FIG. 1.

As shown in FIG. 2, a plurality of spaced, parallel vanes 20 extend between and are in perpendicular contact with the front and back panels 12 and 14. The vanes 20 provide support between the front and back panels 12 and 14 to withstand the force of atmospheric pressure when the display device is evacuated. Each of the vanes 20 is a flat plate of an insulating material, such as glass or ceramic. On each of the major surfaces of each of the vanes 20 are a plurality of conductors 22 which extend to an edge of their respective vanes. As shown, the conductors 22 extend to the edge of the vanes 20 which are adjacent to the front panel 12. The conductors 22 are strips of an electrically conductive material, such as a metal, either bonded to or coated on the surfaces of the vanes 20. The conductors 22 are connected to various elements of the display device, such as multiplier dynodes and electrodes for accelerating, modulating and focusing electron beams in the display device. However, the conductors 22 on the vanes 20 adjacent the side walls 16 extend and are electrically connected to leads 18 on the terminal area.

Figure 3:
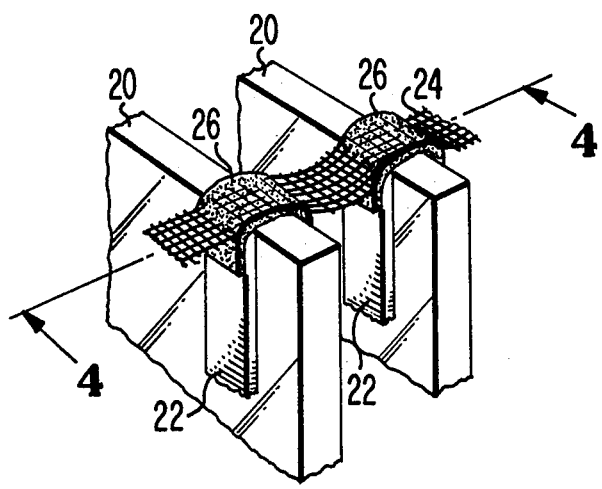
FIG. 3, is a perspective view of a portion of the display device showing one form of the electrical connection of the present invention.

A plurality of perforated interconnectors 24 extend transversely across the edges of the vanes 20 to which the conductors 22 extend. Each of the interconnectors 24 extend across the edge of each of the vanes 20 in contour with a conductor 22 on each vane. As shown in FIG. 3, each of the interconnectors 24 is a relatively thin, flat, flexible strip of an electrically conductive material such as a metal, having a plurality of openings therethrough. Each of the interconnectors 24 may, for example, may be a thin metal strip having a plurality of holes therethrough, or a strip of metal which has been slit and expanded to form the openings, or a woven wire mesh.

Figure 4:
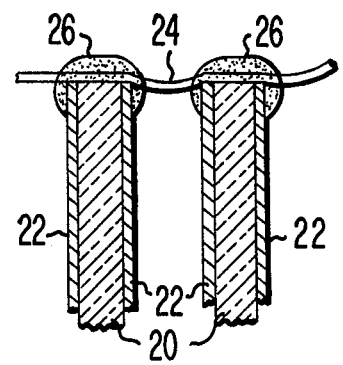
FIG. 4, is a sectional view taken along line 4—4 of FIG. 3.

As shown in FIGS. 3 and 4, each interconnector 24 engages the edge of each of the vanes 20 and preferably has a slight sag between the vanes 20. An electrically conductive bonding material 26 is on each of the interconnectors 24 at each of the vanes 20. The bonding material 26 extends through the openings in the interconnector 24 and contacts the vane 20 and the conductors 22 adjacent the interconnector 24. The bonding material 26 is a material which adheres well to the vanes 20 so as to mechanically secure the interconnectors 24 to the vanes, and which makes good electrical connection to the conductors 22 so as to provide a good electrical connection between the interconnectors 24 and the conductors 22. The bonding material 26 may be a highly conductive solder or metal particles in a binder, such as glass or a plastic. If the vanes 20 are of glass, a preferred bonding material 26 is conductive particles in a glass binder.

Figure 5:
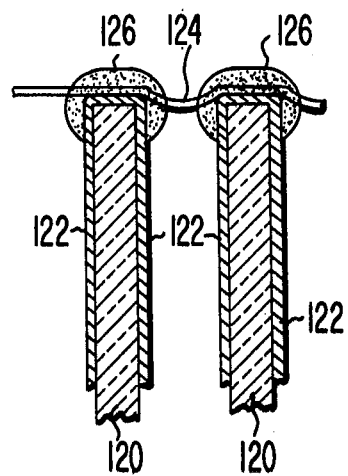
FIG. 5, is a sectional view similar to FIG. 4 of another form of the connection of the present invention.

Referring to FIG. 5, in another form of the connection of the present invention, conductors 122 provided on vanes 120 not only extend to the edge of the vanes 120 but also extend across the edge of the vanes. A perforated interconnector 124 extends across the edge of the vanes and contacts the portion of the conductors 122 which is on the edge of the vanes. A bonding material 126 is provided on the interconnector 124 over each of the vanes 120. The bonding material 126 extends through the openings in the interconnector 124 and is adhered to the vanes 120. This form of the connection has the advantage that the interconnectors 124 directly contact the conductors 122 so as to insure a good electrical connection therebetween. Also, since the electrical connection to the conductors is at the edge of the vanes, the connection does not have to rely on the bonding material flowing across the sides of the vanes to contact the conductors and this further insures a good electrical connection between the interconnectors and the conductors. In addition, since the interconnectors 124 are in direct electrical connection with the conductors 122, it is not necessary that the bonding material 126 be of an electrically conductive material, although it is preferred to use an electrically conductive bonding material to better insure a good electrical connection.

Figure 6:
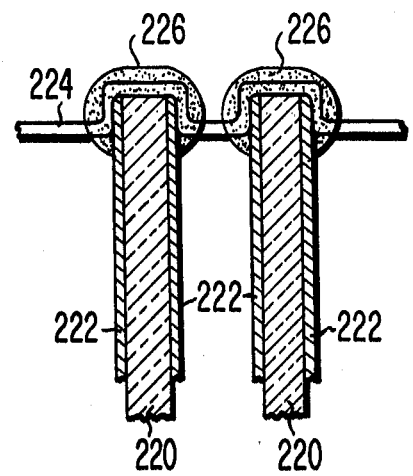
FIG. 6, is a sectional view similar to FIG. 4 showing still another form of the connection of the present invention.

Referring to FIG. 6, in still another form of the connection of the present invention, conductors 222 extend only to the edge of vanes 220. However, a perforated interconnector 224 not only extends across the edges of the vanes 220 but also along a portion of the sides of the vanes to engage the conductors 222. A bonding material 226 is provided on the interconnectors 224 at each of the vanes 220 and extends through the openings in the interconnector to contact the vanes 220. Thus, in this form of interconnection, the interconnectors directly engage the conductors so as to insure good electrical connection therewith. Also, there is increased area of contact between the interconnector and the conductors to provide a better connection. Although the bonding material 226 is preferably of an electrically conducting material so as to provide further electrical connection between the interconnectors 224 and the conductors 226, since the interconnectors directly engage the conductors it is possible to use a bonding material which is not electrically conductive but which merely provides a mechanical bond between the interconnector and the vane.

In the connection of the present invention the use of a flat strip having a plurality of openings therethrough, as the interconnector has a number of advantages over using a plain wire or ribbon. Such a flat strip of a particular conductivity is more flexible than a wire or ribbon of the same conductivity. A flexible interconnector is desirable to permit movement between the vanes, which may occur during assembly or use of the display device, without breaking either the interconnector or connection between the interconnector and the vanes. The flexibility of the interconnector also allows for greater ease of aligning the interconnector with each of the conductors on the vanes even if these conductors are not in absolute direct alignment. Also, the flat strip with apertures therethrough permits the achieving of a better mechanical connection between the interconnectors and the vanes than does a plain wire or ribbon. With the flat strip the bonding material not only extends over the strip but also through the openings so as to provide a larger surface contact with the strip than would the bonding material provide with merely extending around a wire. Thus, the present invention permits making electrical connection between conductors on spaced parallel plates with ease and with assurance of achieving and maintaining a good electrical and mechanical connection. Also the connections between the interconnector and each of the vanes and conductors is readily accessible so as to permit ease of repair of any poor connection. Although the spaced plates are shown as being of insulating material with conductors on the surface thereof, the interconnection of the present invention can also be used to connect plates which are of an electrical conducting material. For this use, the bonding material would electrically connect the interconnectors directly to the plates.

Figure 7:
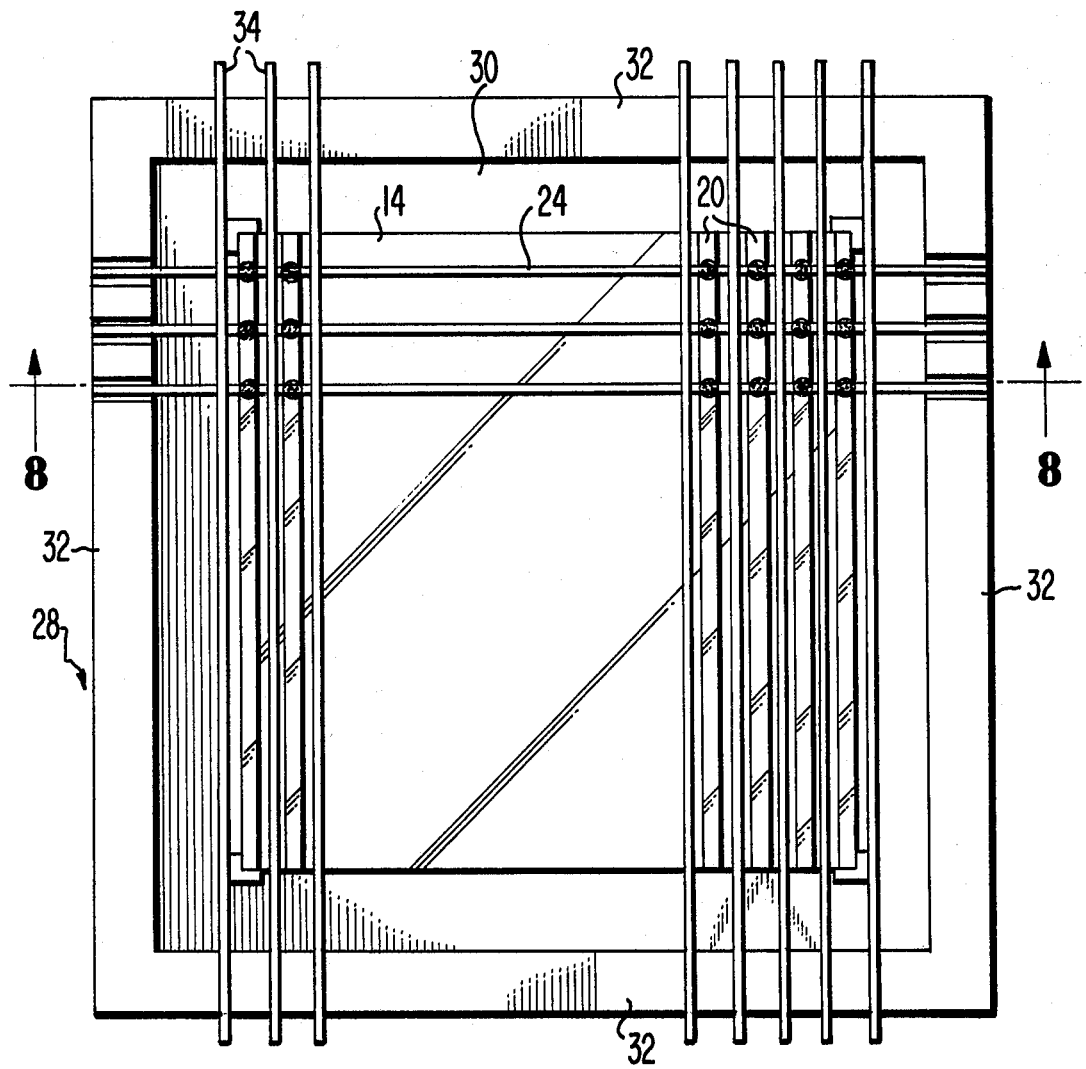
FIG. 7, is a top plan view of an apparatus which can be used for making the connection of the present invention.
Figure 8:
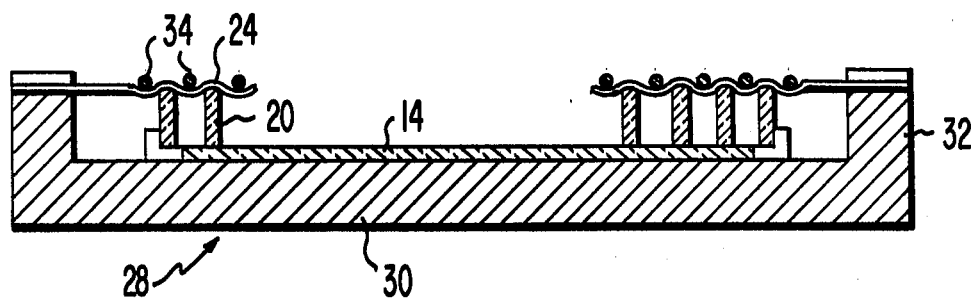
FIG. 8, is a sectional view taken along line 8—8 of FIG. 7.

Referring to FIGS. 7 and 8, there is shown one form of an apparatus, generally designed as 28, which can be used for making the connections. The apparatus 28 comprises a flat, rectangular base 30, having upstanding side walls 32. In the use of the apparatus 28, a back panel 14 having the vanes 20 mounting thereon is seated on the base 30 within the side walls 32. The back panel 14 is positioned so that the vanes 20 extend parallel to a pair of the opposed side walls 32. The interconnector strips 24 are then placed transversely across the edges of the vanes 20, and the end portions of the interconnectors are clamped or secured to the side walls 32. Hold down wires or rods 34 are then placed transversely across the interconnectors 24 on each side of each of the vanes 20 and the end portions of the hold down wires are clamped or secured to the side walls 32. As shown in FIG. 8, the hold down wire 34 serves to hold the interconnectors 24 against the edges of the vanes 20 and to provide the desired slot in the interconnectors between the vanes 20. A glob of the bonding material 26 is then placed on each of the interconnectors 24 at each point where the interconnector crosses a vane 20. The assembly may then be heated to cure or set the bonding material. If the bonding material is initially in a fluid form, it will flow through the opening in the interconnectors to contact the vanes 20 and the conductors 22. If the bonding material is initially in solid form, the assembly will then be heated to cause the bonding material to be melted so that it will then flow through the opening in the conductors to contact the vanes and the conductors 22. For a bonding material comprising conductive particles in a glass binder, the assembly is heated to a temperature at which the glass becomes molten to cause the glass and metal particles to flow onto the vanes and the conductors 22. When the assembly is cooled, the glass will solidify and provide the mechanical bond of the interconnectors 24 to the vanes 20. Since the interconnectors 24 are readily exposed, any poor connections can be easily repaired.

We claim:
1. An apparatus including
a plurality of spaced plates, either of an electrically conductive material or having an electrical conductor on a surface thereof with each of said conductors extending to an edge of its respective plate,
a substantially flat perforated interconnector of an electrically conductive material extending across each of said edges of said plates adjacent said conductors and along a portion of said surface of each plate engaging the plate or the conductor on said surface, and
an electrically conductive bonding material on said interconnector at each of said plates, said bonding material extending through the openings in the interconnection so as to secure the interconnection to the plates and electrically connect said interconnector to the conductor on each of said plates.

2. An apparatus in accordance with claim 1 in which the interconnector comprises a flat, flexible strip of metal having a plurality of holes therethrough.

3. An apparatus in accordance with claim 1 in which the interconnector comprises a flat strip of wire mesh.

4. An apparatus in accordance with claim 1 in which the interconnector has a slight sag therein between each of said plates.